(12) United States Patent
Shih et al.

(10) Patent No.: US 11,417,602 B2
(45) Date of Patent: *Aug. 16, 2022

(54) SEMICONDUCTOR DEVICE HAVING AN EXTRA LOW-K DIELECTRIC LAYER AND METHOD OF FORMING THE SAME

(71) Applicant: TAIWAN SEMICONDUCTOR MANUFACTURING CO., LTD., Hsinchu (TW)

(72) Inventors: Po-Cheng Shih, Hsinchu (TW); Chia Cheng Chou, Keelung (TW); Li Chun Te, Renwu Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 11 days.

This patent is subject to a terminal disclaimer.

(21) Appl. No.: 16/919,234

(22) Filed: Jul. 2, 2020

(65) Prior Publication Data

US 2020/0335449 A1    Oct. 22, 2020

Related U.S. Application Data

(63) Continuation of application No. 15/492,243, filed on Apr. 20, 2017, now Pat. No. 10,707,165.

(51) Int. Cl.
*H01L 21/768* (2006.01)
*H01L 23/532* (2006.01)
(Continued)

(52) U.S. Cl.
CPC .. *H01L 23/53238* (2013.01); *H01L 21/02115* (2013.01); *H01L 21/02126* (2013.01);
(Continued)

(58) Field of Classification Search
CPC .......... H01L 23/53238; H01L 23/5226; H01L 23/5329; H01L 23/53295; H01L 21/02115;
(Continued)

(56) References Cited

U.S. PATENT DOCUMENTS 8,043,959 B2    10/2011   Iin et al.
9,437,484 B2     9/2016   JangJian et al.
(Continued)

FOREIGN PATENT DOCUMENTS

DE    10 2015 107 271 A1    4/2016
JP       2004-281535 A      10/2004
(Continued)

OTHER PUBLICATIONS

Non-Final Office Action issued in U.S. Appl. No. 15/492,243, dated Oct. 19, 2017.
(Continued)

*Primary Examiner* — Timor Karimy
(74) *Attorney, Agent, or Firm* — McDermott Will & Emery LLP

(57) ABSTRACT

A method for manufacturing an extra low-k (ELK) inter-metal dielectric (IMD) layer includes forming a first IMD layer including a plurality of dielectric material layers over a substrate. An adhesion layer is formed over the first IMD layer. An ELK dielectric layer is formed over the adhesion layer. A protection layer is formed over the ELK dielectric layer. A hard mask is formed over the protection layer and is patterned to create a window. Layers underneath the window are removed to create an opening. The removed layers include the protection layer, the ELK dielectric layer, the adhesion layer, and the first IMD layer. A metal layer is formed in the opening.

20 Claims, 5 Drawing Sheets

(51) Int. Cl.
*H01L 21/02* (2006.01)
*H01L 23/522* (2006.01)

(52) U.S. Cl.
CPC .. *H01L 21/02164* (2013.01); *H01L 21/02178* (2013.01); *H01L 21/02211* (2013.01); *H01L 21/02216* (2013.01); *H01L 21/02266* (2013.01); *H01L 21/02274* (2013.01); *H01L 21/76804* (2013.01); *H01L 21/76832* (2013.01); *H01L 21/76883* (2013.01); *H01L 23/5226* (2013.01); *H01L 23/5329* (2013.01); *H01L 23/53295* (2013.01)

(58) Field of Classification Search
CPC ......... H01L 21/02126; H01L 21/02164; H01L 21/02178; H01L 21/02211; H01L 21/02216; H01L 21/02266; H01L 21/02274; H01L 21/76804; H01L 21/76832; H01L 21/76883
See application file for complete search history.

(56) References Cited

U.S. PATENT DOCUMENTS

| | | | |
|---|---|---|---|
| 9,768,061 | B1 | 9/2017 | Shih et al. |
| 10,707,165 | B2 * | 7/2020 | Shih .................... H01L 23/5329 |
| 2003/0034554 | A1 | 2/2003 | Onitani et al. |
| 2003/0134499 | A1 | 7/2003 | Chen et al. |
| 2005/0042889 | A1 | 2/2005 | Lee et al. |
| 2005/0233572 | A1 | 10/2005 | Su et al. |
| 2005/0253271 | A1 | 11/2005 | Nakata et al. |
| 2007/0063188 | A1 | 3/2007 | Rantala et al. |
| 2008/0254641 | A1 | 10/2008 | Kobayashi et al. |
| 2014/0213060 | A1 | 7/2014 | Kao et al. |
| 2014/0332962 | A1 | 11/2014 | Lee et al. |
| 2015/0028483 | A1 | 1/2015 | Zhou |
| 2015/0235922 | A1 | 8/2015 | Chen et al. |
| 2016/0351669 | A1 | 12/2016 | Shiao et al. |
| 2018/0226294 | A1 | 8/2018 | Stephens et al. |

FOREIGN PATENT DOCUMENTS

| | | |
|---|---|---|
| KR | 10-2004-0074675 A | 8/2004 |
| KR | 10-2013-0043096 A | 4/2013 |
| KR | 10-2015-0135045 A | 12/2015 |
| TW | 201230192 A | 7/2012 |
| TW | 201616568 A | 5/2016 |
| TW | 201705364 A | 2/2017 |
| WO | 2011/106218 A2 | 9/2011 |

OTHER PUBLICATIONS

Final Office Action issued in U.S. Appl. No. 15/492,243, dated Jul. 26, 2018.

Non-Final Office Action issued in U.S. Appl. No. 15/492,243, dated Feb. 27, 2019.

Non-Final Office Action issued in U.S. Appl. No. 15/492,243, dated Aug. 19, 2019.

Notice of Allowance issued in U.S. Appl. No. 15/492,243, dated Mar. 2, 2020.

* cited by examiner

SEMICONDUCTOR DEVICE HAVING AN EXTRA LOW-K DIELECTRIC LAYER AND METHOD OF FORMING THE SAME

CROSS-REFERENCE TO RELATED APPLICATIONS

This application is a Continuation of U.S. patent application Ser. No. 15/492,243 filed on Apr. 20, 2017, the entire disclosure of the application is incorporated herein by reference.

TECHNICAL FIELD

The disclosure relates to semiconductor integrated circuit manufacturing.

BACKGROUND

With the progress of transistor process technology, the dimension of transistors has shrunk and therefore the number of transistors per unit area of an integrated circuit has increased accordingly. The increased device density demands higher interconnect technology that can achieve signal transport between devices with a desired speed and satisfy low resistance and low capacitance (e.g., low RC time constant) requirements. The effect of interconnect RC time constant on signal delay is exacerbated as integrated circuits become more complex and feature sizes decreases. In semiconductor back-end-of line (BEOL) processing, metal interconnect structures are fabricated with inter-metal dielectric (IMD) layers, which can contribute capacitance to the metal interconnect structures. The capacitance contribution can undesirably reduce signal transport speed of the semiconductor circuitry.

The use of low dielectric constant (low-k) dielectric material to form the IMD layers has to some extent reduced the capacitance contribution and improved signal transport speed. However, the low-k dielectric material has disadvantageous features and properties such as high porosity, which make it susceptible to damage during certain semiconductor processes such as etching, deposition, and wet processes, which can degrade (increase) their dielectric constants.

Solutions are required that can achieve a desired capacitance, yield, and reliability, particularly at advanced technologies, for example, the 5-nanaometer node (N5) and beyond.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed, interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The device may be otherwise oriented (rotated 90 degrees or at other orientations), and the spatially relative descriptors used herein may likewise be interpreted accordingly. In addition, the term "made of" may mean either "comprising" or "consisting of."

Figure 1:
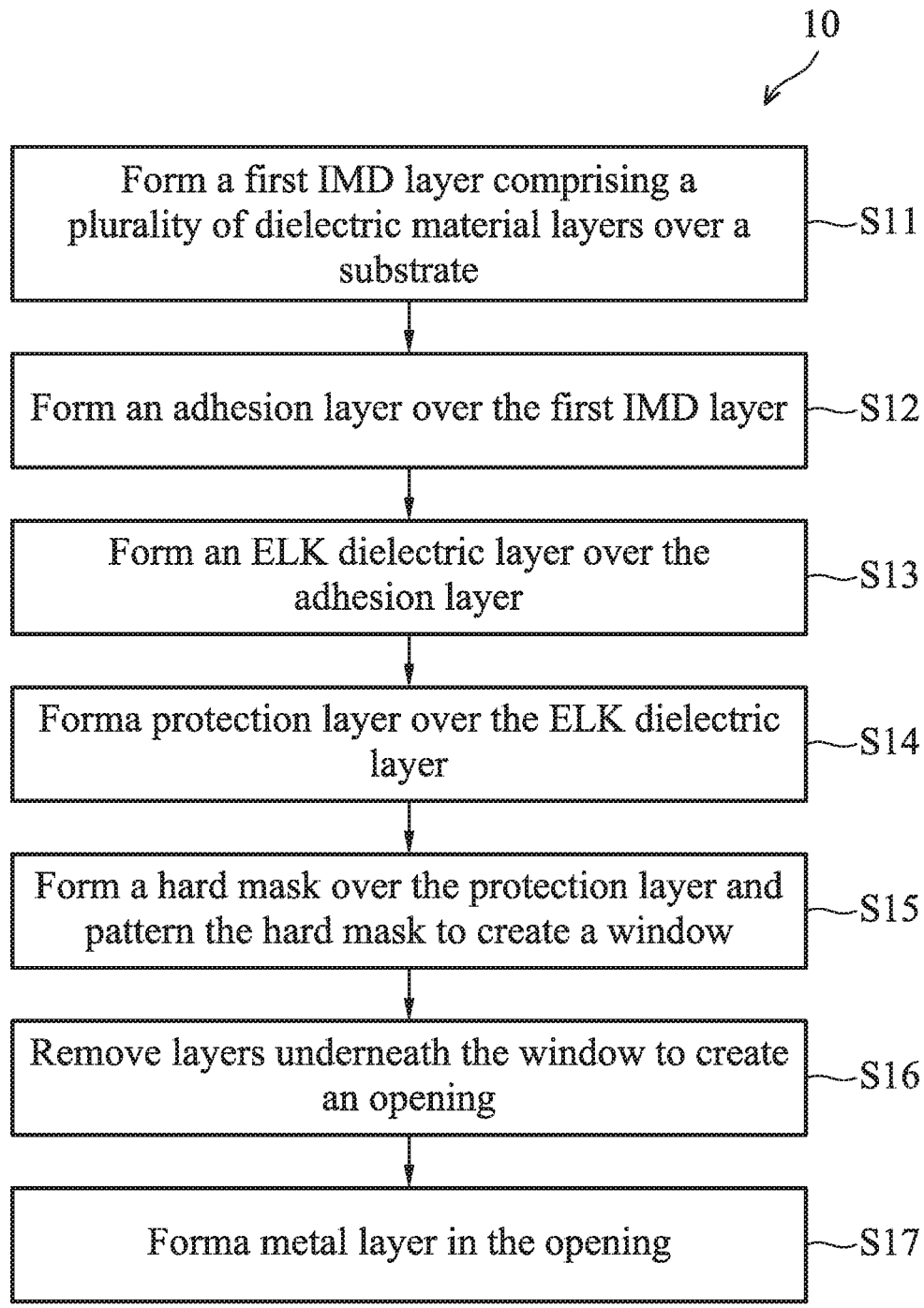
FIG. 1 is an exemplary process flow chart depicting a method of manufacturing an extra low-k (ELK) dielectric layer according to one or more embodiments of the present disclosure.

FIG. 1 is an exemplary process flow chart depicting a method 10 of manufacturing an extra low-k (ELK) dielectric layer according to one or more embodiments of the present disclosure. The method 10 illustrates a relevant part of the entire manufacturing process. It is understood that additional operations may be provided before, during, and after the operations shown by FIG. 1, and some of the operations described below can be replaced or eliminated for additional embodiments of the method. The order of the operations/processes may be interchangeable.

Figure 2:
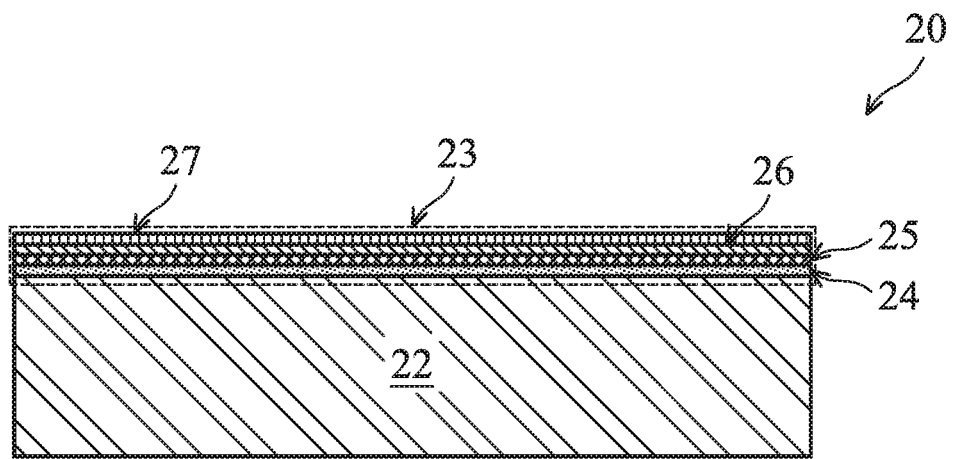
FIG. 2 depicts one stage in a method of manufacturing an ELK dielectric layer according to one or more embodiments of the present disclosure.

In S11 of FIG. 1, a first inter-metal dielectric (IMD) layer 23 is formed over a substrate 22, as shown in an X-Z cut view 20 of FIG. 2. The substrate 22 can be, for example, a wafer or such as silicon or germanium wafer or an in-process substrate including a number of semiconductor devices such as filed-effect transistors (FETs) including metal oxide semiconductor (MOS) FET or Fin FETs formed over a base substrate. In some embodiments, various routing interconnections, for example, conductive power and signal routing interconnections for the semiconductor devices can be implemented by creating back-end-of-line (BEOL) metal and dielectric layers as discussed in further details herein. The base substrate can be a p-type silicon substrate with an impurity concentration in a range of about $1 \times 10^{15}$ cm$^{-3}$ to about $3 \times 10^{15}$ cm$^{-3}$ in some embodiments. In other embodiments, the base substrate can be an n-type silicon substrate with an impurity concentration in a range of about $1 \times 10^{15}$ cm$^{-3}$ to about $3 \times 10^{15}$ cm$^{-3}$. The crystal orientation of silicon substrate is (100) in some embodiments.

Alternatively, the base substrate may comprise another elementary semiconductor, such as germanium, a compound semiconductor including Group IV-IV compound semiconductors such as silicon carbide (SiC) and silicon germanium (SiGe), and Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one or more embodiments, the base substrate is a silicon layer of an SOI (silicon-on-insulator) substrate. Amorphous substrates, such as amorphous silicon or amorphous silicon carbide (SiC), or insulating material, such as silicon oxide, may also be used as the base substrate. The base substrate may include various regions that have been suitably doped with impurities (e.g., p-type or n-type conductivity).

In some embodiments, the IMD layer 23 includes a number of layers such as an aluminum nitride layer 24, a first oxygen doped carbide (ODC) layer 25 (e.g., an oxygen doped silicon carbide), an aluminum oxide ($Al_2O_3$) layer 26, and a second ODC layer 27, as shown in the X-Z cut view 20 of FIG. 2. The aluminum nitride layer 24 with thickness within a range of about 3-5 nanometer can be formed using a plasma enhanced chemical vapor deposition (PECVD) or a physical vapor deposition (PVD) process, in some embodiments. It is known that aluminum nitride has a number of advantageous features including uniform microstructure, high thermal conductivity, high electrical resistivity, and chemical stability up to about 980° C. In some embodiments, the first and second ODC layers 25 and 27 can be deposited using PECVD or PVD processes. The thickness of the first and second ODC layers 25 and 27 can be within a range of about 3-5 nanometers. In some embodiment, the aluminum oxide ($Al_2O_3$) layer 26 can have a thickness within a range of about 3-5 nanometers and is deposited using PECVD or PVD processes. In some embodiments, other deposition processes can be used and the layers of the IMD layer 23 can be different dielectric materials having different thicknesses. The stacked structure of the IMD layer 23 is not limited to the above described configuration. The IMD layer 23 may be a single dielectric layer or may be multiple dielectric layers made of any suitable dielectric material, respectively.

Figure 3:
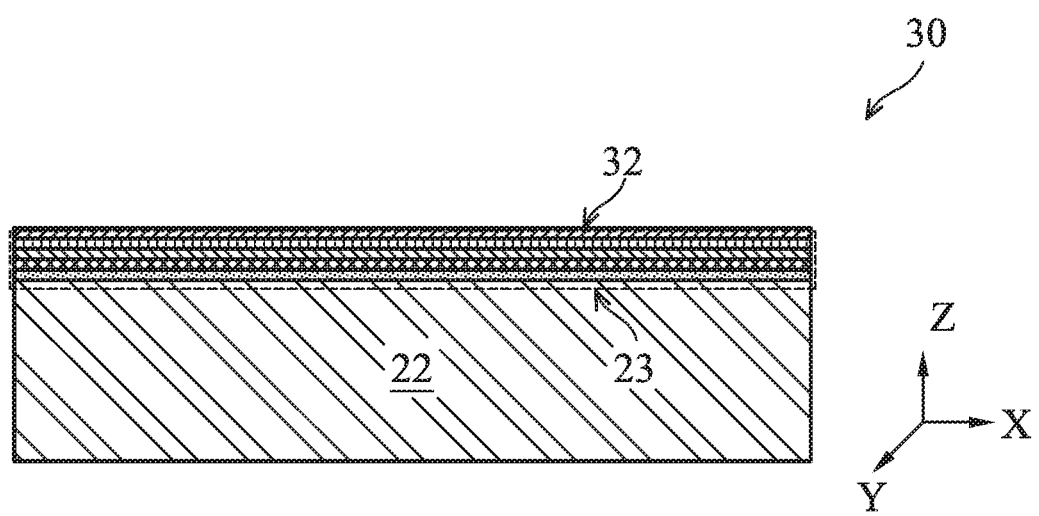
FIG. 3 depicts one stage in a method of manufacturing an ELK dielectric layer according to one or more embodiments of the present disclosure.

In S12 of FIG. 1, an adhesion layer 32 is formed over the IMD layer 23 by using PECVD or PVD processes, as shown in an X-Z cut view 30 of FIG. 3. In some embodiments, the adhesion layer is an oxide layer or a carbide layer, but is not limited to these compounds, and can enhance the adhesion of the next layer to the IMD layer 23. The oxide layer can be silicon oxide ($SiO_2$) and the carbide layer can be silicon oxycarbide (SiOC), in some embodiments, although other material or compounds can also be used.

Figure 4:
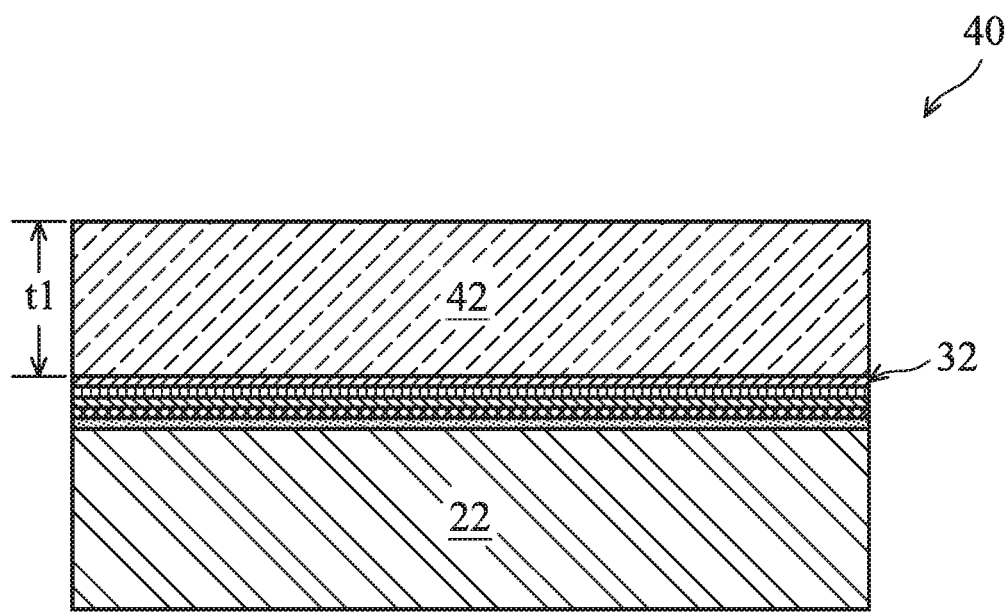
FIG. 4 depicts one stage in a method of manufacturing an ELK dielectric layer according to one or more embodiments of the present disclosure.

In S13 of FIG. 1, an ELK dielectric layer 42 is formed over the adhesion layer 32, as shown in an X-Z cut view 40 of FIG. 4. In some embodiments, the ELK dielectric layer 42 is a dense layer of a carbon-doped oxygen-rich silicon oxide material. In some embodiments, the ELK dielectric layer 42 can be deposited using a low flow rate of a precursor in a PECVD or a PVD process. The precursor can be methyl-diethoxymethylsilane (mDEOS), in some embodiments. In some embodiments, the low flow rate is a flow rate of less than about 900 standard cubic centimeters per minute (sccm).

In some embodiments, the ELK dielectric layer 42 is formed by using a low precursor-to-carrier gas flow rate ratio in the PECVD or PVD process. A carrier gas can be helium (He) and the low precursor-to-carrier gas flow rate ratio is less than about 0.4, in some embodiments. Other carrier gases and different precursor to carrier gas flow rate ratio may be used, in other embodiments. In some embodiments, the ELK dielectric layer 42 has a dielectric constant less than about 3.4. The thickness µl of the ELK dielectric layer 42 can be within a range of about 20-100 nm, in some embodiments. In some embodiments, the dense layer of a carbon-doped oxygen-rich silicon oxide material of the ELK dielectric layer 42 has a carbon content within a range of about 5-30 atomic percent, an oxygen content within a range of about 40-55 atomic percent, and a silicon content within a range of about 30-40 atomic percent. The ELK dielectric layer 42 is much denser that the traditional LK material and can have a hardness within a range of about 3-10 GPa.

The ELK dielectric layer of the subject technology has a number of advantageous features with respect to the traditional LK material. For example, the ELK dielectric layer of the subject technology improves coupling capacitance of the metal interconnect lines (e.g., by more than 1-1.5 percent) that can in turn result in higher speed of the semiconductor devices. Further, the ELK dielectric layer 42 is more reliable and is less prone to damage than the traditional LK material.

Figure 5:
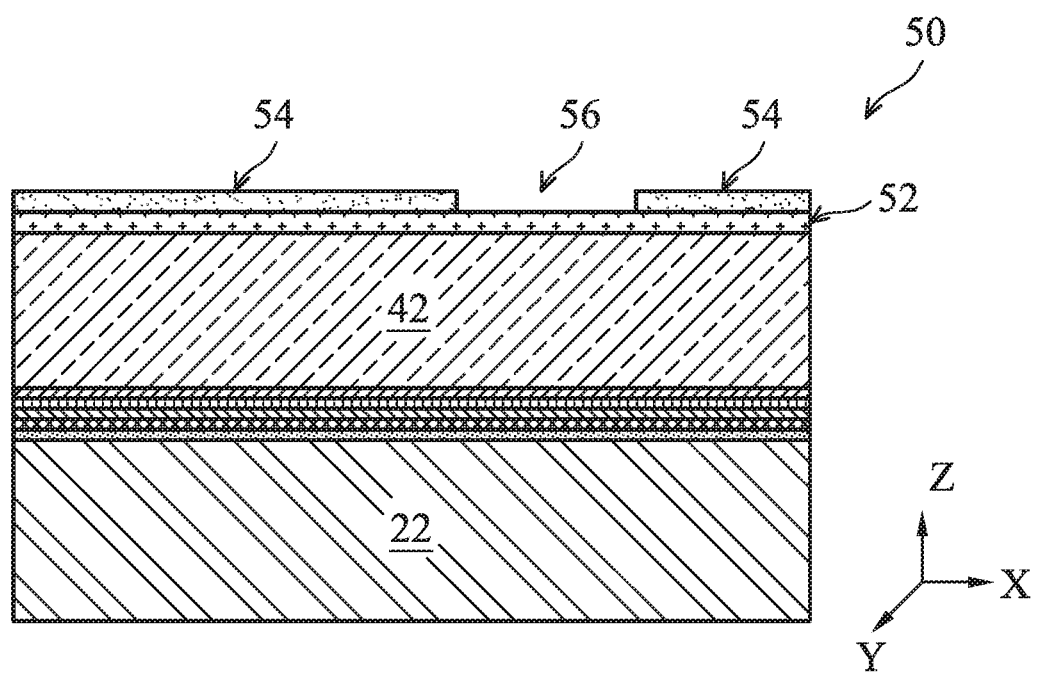
FIG. 5 depicts one stage in a method of manufacturing an ELK dielectric layer according to one or more embodiments of the present disclosure.

In S14 of FIG. 1, a protection layer 52 is formed over the ELK dielectric layer 42, as shown in an X-Z cut view 50 of FIG. 5. In some embodiments, the protection layer 54 is a dielectric cap made of a nitrogen-free antireflection layer (NFARL). The NFARL layer is used to minimize the total reflection of light from layers under a photoresist layer and to form an interface between the photoresist layer and the underlying layer. The NFARL layer can be fabricated in a CVD process, optionally plasma-enhanced, using a gaseous mixture of carbon, silicon, and oxygen sources. In some embodiments, the process parameters can be adjusted to obtain acceptable values of the refractive index n and extinction coefficient k. The NFARL layer can eliminate the mushrooming and footing problems found with many antireflective layers.

In some embodiments, the protection layer 52 includes tetraethoxysilane (TEOS) based layer, which is a known layer commonly used as a crosslinking agent in silicone polymers and as a precursor to silicon dioxide in the semiconductor industry. In some embodiments, the TEOS based layer can be deposited by spin-on-glass deposition method, although other deposition methods can be used. In some embodiments, the protection cap layer includes a dielectric material, such as ODC, silicon nitride, silicon oxynitride, silicon carbide, other suitable materials, and/or a combination thereof. In some embodiments, the protection layer includes NFARL including silicon monoxide (SiO). In some embodiments, the protection layer includes silicon oxycarbide (SiOC). In those embodiments where the protection layer includes silicon oxycarbide (SiOC), the protection layer has a weight percent of carbon from about 20% to about 45%, a weight percent of oxygen from about 0% to about 20%, and/or a weight percent of silicon from about 30% to about 50%. In some embodiments, the protection layer includes BC, BN, SiBN, SiBC, SiBCN, and/or other materials including boron. In those embodiments, the protection layer has a weight percent of boron from about 5% to about 100%.

In S15 of FIG. 1, a hard mask 54 is formed and patterned over the protection layer 52, as shown in an X-Z cut view 50 of FIG. 5. In some embodiments, the hard mask comprises titanium nitride (TiN), although other hard mask materials may be used. The titanium nitride hard mask 54 can be deposited using a CVD or PVD method, in some embodiments. The hard mask 54 can be patterned to open a window 56 for the next etch process.

Figure 6:
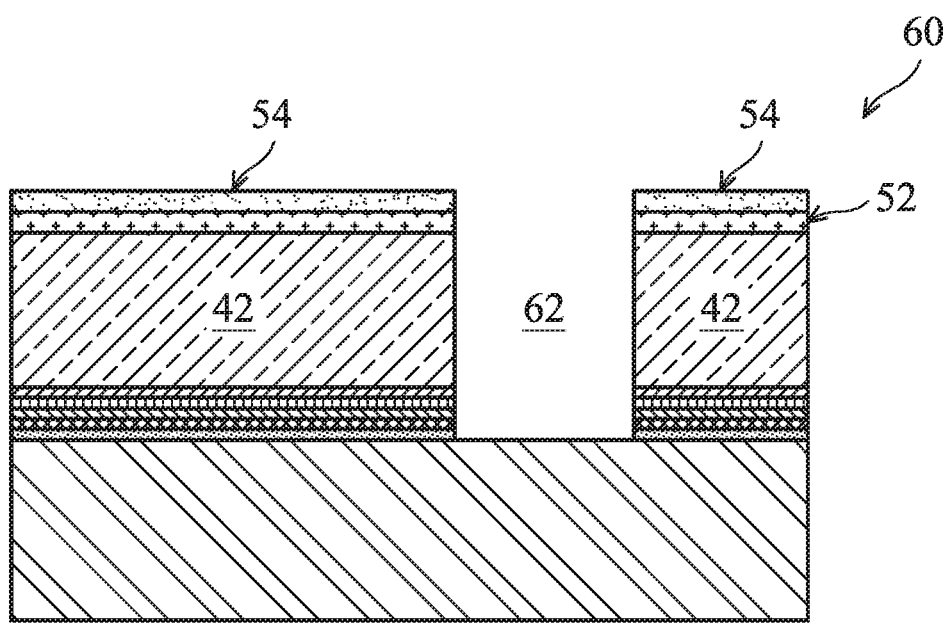
FIG. 6 depicts one stage in a method of manufacturing an ELK dielectric layer according to one or more embodiments of the present disclosure.

In S16 of FIG. 1, layers underneath the window 56 are removed to create an opening 62, as shown in an X-Z cut view 60 of FIG. 6. The layers underneath the window 56 are the, the protection layer 52, the ELK dielectric layer 42, the adhesion layer 32, and the first IMD layer 23.

The opening (trench) 62 can be created using one or more etch operations, including for example, a plasma etch process, in some embodiments, although other etch processes may be used.

Figure 7:
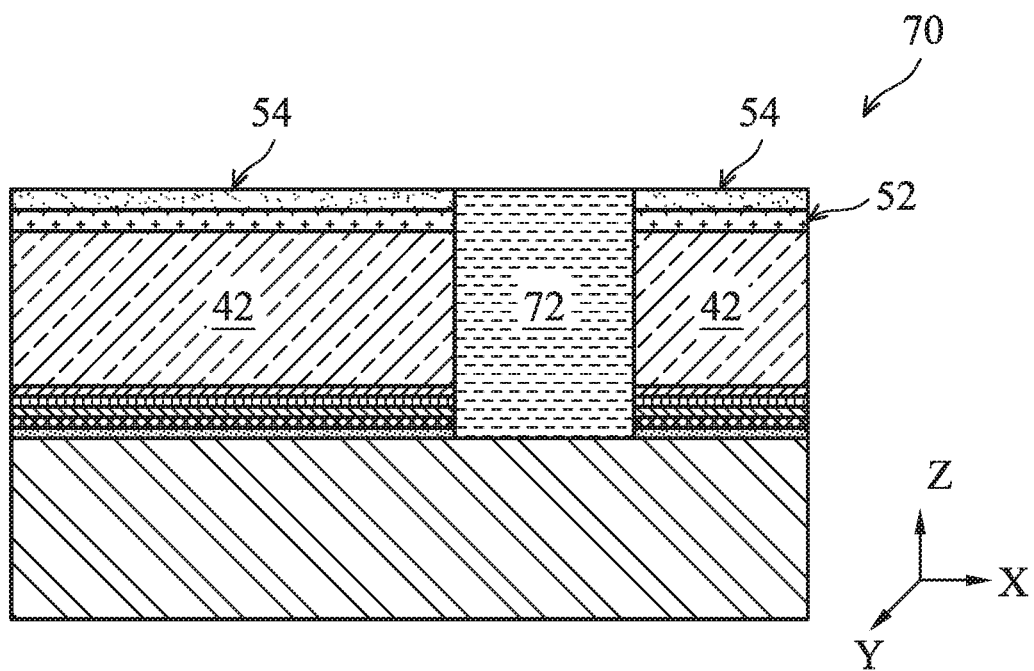
FIG. 7 depicts one stage in a method of manufacturing an ELK dielectric layer according to one or more embodiments of the present disclosure.

In S17 of FIG. 1, a metal layer 72 is formed in the trench 62, as shown in an X-Z cut view 70 of FIG. 7. The metal layer 72 can be aluminum (Al) or copper (Cu). The metal layer 72 is back-end-of-line (BEOL) metal interconnect, in some embodiments. In some embodiments, the metal layer 72 is a via structure coupling two or more metal layers (not shown in FIG. 7 for simplicity). In some embodiments, the metal layer 72 can be deposited using a vapor phase deposition (VPD) process such as an electron beam VPD (EBVPD) process, PVD, CVD or electroplating. Other deposition method can be used to form the metal layer 72, in other embodiments.

Figure 8:
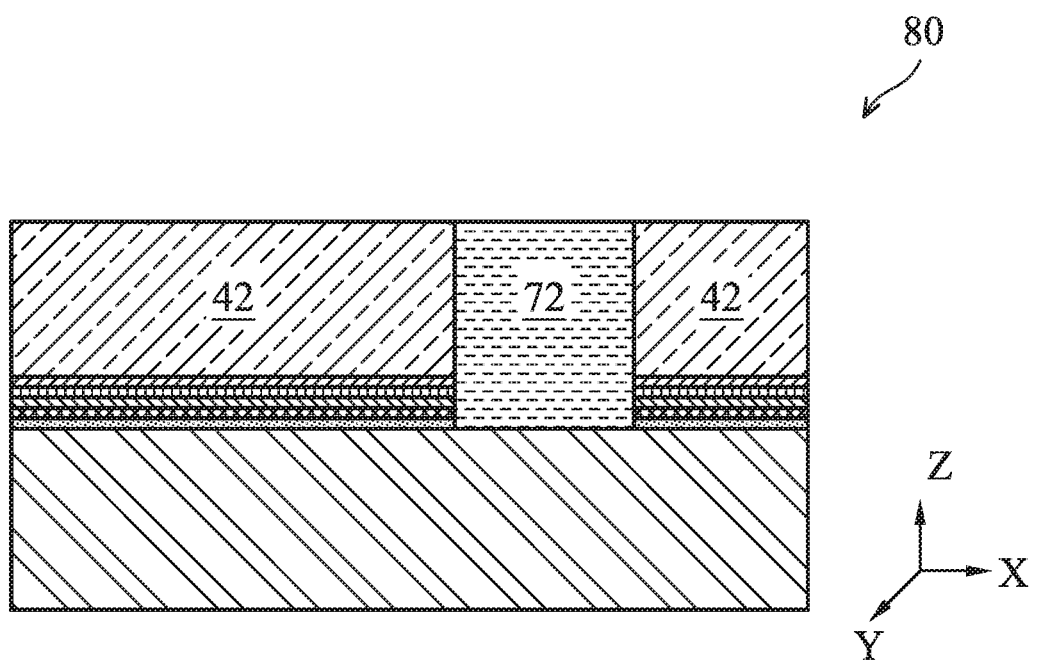
FIG. 8 depicts one stage in a method of manufacturing an ELK dielectric layer according to one or more embodiments of the present disclosure.

In some embodiments, after the deposition of the metal layer 72, a planarization process, for example, a chemical-mechanical planarization (CMP) can be used to remove the protection layer 52 and the hard mask layer 54, as shown in an X-Z cut view 80 of FIG. 8.

It will be understood that not all advantages have been necessarily discussed herein, no particular advantage is required for all embodiments or examples, and other embodiments or examples may offer different advantages.

In accordance with one aspect of the present disclosure, a method for manufacturing an extra low-k (ELK) inter-metal dielectric (IMD) layer includes forming a first IMD layer comprising a plurality of dielectric material layers over a substrate. An adhesion layer is formed over the first IMD layer. An ELK dielectric layer is formed over the adhesion layer. A protection layer is formed over the ELK dielectric layer. A hard mask is formed over the protection layer and is patterned to create a window. Layers underneath the window are removed to create an opening. The removed layers include the protection layer, the ELK dielectric layer, the adhesion layer, and the first IMD layer. A metal layer is formed in the opening. The method may further include performing a planarization process, for example, using a chemical-mechanical planarization.

In some embodiments, the dielectric material layers include an aluminum nitride (AlN) layer, a first oxygen doped carbide (ODC) layer, an aluminum oxide ($Al_2O_3$) layer, and a second ODC layer. In some embodiments, the ELK dielectric layer is a carbon-doped oxygen-rich silicon oxide material. In some embodiments, the ELK dielectric layer is formed using a low flow rate of a precursor in a PECVD or a PVD process. The precursor can include methyl-diethoxymethylsilane (mDEOS) and the low flow rate can be less than about 900 standard sccm, in some embodiments.

In some embodiments, the ELK dielectric layer is formed by using a low precursor to carrier gas flow rate ratio in the PECVD or PVD process. The carrier gas can be helium (He) and the low precursor to carrier gas flow rate ratio is less than about 0.4, in some embodiments. In some embodiments, the adhesion layer is an oxide layer or a carbide layer. In some embodiments, the oxide layer is silicon oxide ($SiO_2$). The carbide layer can be silicon oxycarbide (SiOC), in some embodiments.

In some embodiments, the protection layer is a dielectric cap material including nitrogen-free antireflection layer (NFARL). The protection layer can be a dielectric cap material including tetraethoxysilane (TEOS), in some other embodiments. The hard mask can be titanium nitride (TiN) in some embodiments.

In some embodiments, the metal layer is a back-end-of-line (BEOL) metal-interconnect line. The metal layer can be copper (Cu), in some embodiments. In some embodiments, the substrate is a wafer including a silicon wafer, and the wafer can include electronic circuitry.

In accordance with another aspect of the present disclosure, a method for manufacturing an integrated circuit includes forming a plurality of devices over a substrate to create an in-process substrate. Conductive power and signal routing interconnections for the devices by can be implemented by creating BEOL metal and dielectric layers. Creating BEOL metal and dielectric layers includes forming an inter-metal dielectric (IMD) layer over the in-process substrate and forming an extra low-k (ELK) dielectric layer over the IMD. A dielectric cap is formed over the ELK dielectric layer. A hard mask including titanium nitride (TiN) is formed over the dielectric cap and the hard mask is patterned to create a window. Layers underneath the window are removed to create a trench. The removed layers include the dielectric cap, the ELK dielectric layer, and the IMD layer. A metal layer including copper (Cu) is formed in the trench.

In some embodiments, the first IMD layer includes a plurality of dielectric material layers including an aluminum nitride (AlN) layer, a first oxygen doped carbide (ODC) layer, an aluminum oxide ($Al_2O_3$) layer, and a second ODC layer. In some embodiments, the ELK dielectric layer includes a carbon-doped oxygen-rich silicon oxide material formed using a chemical vapor deposition (PECVD) or a physical vapor deposition (PVD) process. The ELK dielectric layer is formed using a low flow rate of a precursor including methyl-diethoxymethylsilane (mDEOS), in some embodiments. In some embodiments, the low flow rate is less than about 900 sccm.

In some embodiments, the ELK dielectric layer is formed using a low precursor to helium (He) gas flow rate ratio in a PECD or PVD process. The low precursor to carrier gas flow rate ratio is less than about 0.4, in some embodiments.

In some embodiments, an adhesion layer is formed over the IMD layer prior to formation of the ELK dielectric layer. The adhesion layer includes silicon oxide ($SiO_2$) or silicon oxycarbide (SiOC), in some embodiments. In some embodiments, the dielectric cap includes nitrogen-free antireflection layer (NFARL).

In accordance with yet another aspect of the present disclosure, an integrated circuit includes a plurality of devices implemented over a substrate to create an in-process substrate. BEOL metal and dielectric layers are configured to provide power and signal routing interconnections for the plurality of devices. The BEOL metal and dielectric layers include a first IMD layer comprising a plurality of dielectric material layers formed over an in-process substrate. An adhesion layer including one of silicon oxide (SiO₂) or silicon oxycarbide (SiOC) is formed over the first IMD layer. An ELK dielectric layer including carbon-doped oxygen-rich silicon oxide material is formed over the adhesion layer. A protection layer is formed over the ELK dielectric layer. A metal layer is formed in an opening in the protection layer, the ELK dielectric layer, the adhesion layer, and the first IMD layer.

The foregoing outline features several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an integrated circuit, comprising:
    forming an IMD layer comprising an aluminum nitride layer, a first oxygen doped carbide (ODC) layer, an aluminum oxide layer, and a second ODC layer over a substrate;
    forming an extreme low-k (ELK) dielectric layer over the IMD layer;
    forming a hard mask over the ELK dielectric layer and patterning the hard mask to create a window;
    removing layers underneath the window to create an opening, wherein the removed layers includes the ELK dielectric layer and the IMD layer; and
    forming a metal layer in the opening.

2. The method of claim 1, further comprising performing a planarization process, wherein the planarization process comprises a chemical-mechanical planarization (CMP).

3. The method of claim 2, wherein the planarization process removes the hard mask and over the ELK dielectric layer.

4. The method of claim 1, wherein the forming of the ELK dielectric layer comprises using a low flow rate of a precursor in a plasma enhanced chemical vapor deposition (PECVD) or a physical vapor deposition (PVD) process, wherein the precursor comprises methyl-diethoxymethylsilane (mDEOS) and the low flow rate is a flow rate of less than about 600 standard cubic centimeters per minute (sccm).

5. The method of claim 4, wherein the forming of the ELK dielectric layer comprises using a low precursor-to-carrier gas flow rate ratio in the PECVD or PVD process, wherein a carrier gas comprises helium (He) and the low precursor-to-carrier gas flow rate ratio is less than about 0.2.

6. The method of claim 1, wherein the ELK dielectric layer comprises a carbon-doped oxygen-rich silicon oxide material.

7. The method of claim 1, further comprising:
    disposing an adhesion layer between the IMD layer and the ELK dielectric layer.

8. The method of claim 1, further comprising:
    disposing a protection layer over the ELK dielectric layer.

9. A method for manufacturing an integrated circuit, comprising:
    disposing an inter-metal dielectric (IMD) layer over an in-process substrate, wherein the in-process substrate comprises a plurality of devices and conductive power and signal routing interconnections for the plurality of devices, wherein the signal routing interconnections for the plurality of devices comprise back-end-of-line (BEOL) metal and dielectric layers, and wherein the IMD layer comprises a plurality of dielectric material layers that comprises an aluminum nitride layer, a first oxygen doped carbide (ODC) layer, an aluminum oxide layer, and a second ODC layer;
    disposing an extreme low-k (ELK) dielectric layer comprising a carbon-doped oxygen-rich silicon oxide material over the IMD layer;
    forming a trench that extends in a thickness direction of the ELK dielectric layer in the ELK dielectric layer; and
    disposing a metal layer in the trench.

10. The method of claim 9, wherein prior to disposing the IMD layer, the in-process substrate comprises of one or more semiconductor devices including a field-effect transistor (FET).

11. The method of claim 10, wherein prior to disposing the IMD layer, the in-process substrate comprises of one or more semiconductor devices including a metal oxide semiconductor (MOS) FET.

12. The method of claim 10, wherein prior to disposing the IMD layer, the in-process substrate comprises of one or more semiconductor devices including a Fin FET.

13. The method of claim 10, wherein the trench extends in the ELK dielectric layer from a top level of the ELK dielectric layer to the IMD layer.

14. The method of claim 9, wherein the ELK dielectric layer comprises methyl-diethoxymethylsilane (mDEOS).

15. The method of claim 9, wherein the metal layer comprises copper (Cu).

16. A method for manufacturing an integrated circuit, comprising:
    forming an IMD layer over an in-process substrate, the IMD layer comprising a plurality of dielectric material layers that comprises an aluminum nitride layer, a first oxygen doped carbide (ODC) layer, an aluminum oxide layer, and a second ODC layer;
    forming an extreme low-k (ELK) dielectric layer comprising carbon-doped oxygen-rich silicon oxide material over the IMD layer; and
    forming a metal layer extending in a trench from the ELK dielectric layer to the IMD layer.

17. The method of claim 16, further comprising:
    disposing an adhesive layer between the ELK dielectric layer and the IMD layer.

18. The method of claim 16, further comprising:
    disposing a protection layer over the ELK dielectric layer.

19. The method of claim 16, wherein the metal layer either comprises copper (Cu) or aluminum (Al).

20. The method of claim 16, further comprising:
    forming the trench that extends in a thickness direction of the ELK dielectric layer in the ELK dielectric layer; and
    disposing the metal layer in the trench from the IMD layer up to a top level of the ELK dielectric layer.

* * * * *